(12) United States Patent
Gao et al.

(10) Patent No.: US 9,906,014 B2
(45) Date of Patent: Feb. 27, 2018

(54) CIRCUIT PROTECTION DEVICE WITH AUTOMATIC FAULT MONITORING AND DETECTION FUNCTION

(71) Applicant: ZHEJIANG TRIMONE ELECTRIC SCIENCE & TECHNOLOGY CO., LTD., Pinghu, Zhejiang Province (CN)

(72) Inventors: Shaohua Gao, Pinghu (CN); Gaoke Zheng, Pinghu (CN)

(73) Assignee: ZHEJIANG TRIMONE ELECTRIC SCIENCE & TECHNOLOGY CO., LTD., Pinghu (CN)

( * ) Notice: Subject to any disclaimer, the term of this patent is extended or adjusted under 35 U.S.C. 154(b) by 254 days.

(21) Appl. No.: 14/819,299

(22) Filed: Aug. 5, 2015

(65) Prior Publication Data

US 2016/0315460 A1   Oct. 27, 2016

(30) Foreign Application Priority Data

Apr. 27, 2015   (CN) .......................... 2015 1 0206672

(51) Int. Cl.
*H02H 3/16* (2006.01)
*H02H 3/33* (2006.01)
*G01R 31/02* (2006.01)

(52) U.S. Cl.
CPC ........... *H02H 3/335* (2013.01); *G01R 31/025* (2013.01)

(58) Field of Classification Search
CPC .......... H02H 3/335; H02H 3/162; H02H 3/33; G01R 31/025
USPC .......................................................... 361/42
See application file for complete search history.

(56) References Cited

U.S. PATENT DOCUMENTS

| | | | |
|---|---|---|---|
| 7,253,629 B1* | 8/2007 | Richards ............ | G01R 31/3277 324/424 |
| 2013/0057990 A1* | 3/2013 | Finlay, Sr. ............. | H02H 3/338 361/50 |
| 2014/0361833 A1* | 12/2014 | Rey-Losada .......... | H03F 3/3022 330/255 |

* cited by examiner

*Primary Examiner* — Dharti Patel
(74) *Attorney, Agent, or Firm* — Jiwen Chen

(57) ABSTRACT

A circuit protection device with self fault detection function comprises a ground fault protection unit and a self fault detection unit, the ground fault protection unit can achieve the ground fault detection and protection function for AC power source power circuit and electrical appliance. The self fault detection unit is provided with two delay circuits which can achieve the fault detection at an early stage of power-on and periodically fault detection function. The ground fault protection circuit and the self fault detection unit can operate in time sharing, and achieve self fault detection without interruption of power supply. The self fault detection unit and the ground fault protection unit are separated from high impedance. Any fault occurred on any element in the self fault detection unit may not impair the protection ability of the ground fault protection unit.

18 Claims, 3 Drawing Sheets

CIRCUIT PROTECTION DEVICE WITH AUTOMATIC FAULT MONITORING AND DETECTION FUNCTION

The present application claims the priority benefit of Chinese Application No. 201510206672.2, filed Apr. 27, 2015, which is hereby incorporated by reference.

TECHNICAL FIELD

The present invention relates to an electrical circuit protection technology field, and in particular, it relates to an electrical circuit protection device for automatic monitoring and detecting operation faults, more specifically, a leakage or residual current protection device or a ground-fault circuit interrupter device. The circuit protection device can automatically detect the operation condition, and send alarming signal in case of operation fault.

BACKGROUND OF THE INVENTION

The leakage current protection device, or ground fault circuit interrupter, is used to detect the ground fault current in electronics, instruments, devices, equipments and electrical systems that are powered by electric grid as well as power supply system. When the ground fault current exceeds specified limit, the circuit protection device will automatically shut down the power supply and so as to protect human being and properties. In actual application, the leakage current protection device or ground fault circuit interrupter may partly or wholly malfunction, and the protection function of the ground fault circuit interrupter thereby malfunction, and the users may not be aware of the situation, thus safety risk may occur.

To solve the problems above, some leakage current protection devices are designed according to IEC 61008-1, IEC 61009-1, GB 6829.1 standards and have a test button, but require a user to manually depress the test button periodically, once a month, to test whether the circuit protection function is working properly. For one aspect, it increases user's workload, and for another, the periodic test must cut down the power supply, and cause inconvenience to user. For the third, if the user does not periodically test the circuit, or the circuit protection device malfunctions during two periodic test periods (such as one month), and safety risk may occur.

To solve the problems above, some ground fault circuit interrupters designed according to UL 943 standard are provided with a self fault detection unit to periodically detect and diagnose the working condition of the ground fault circuit interrupter. However, the circuit and structure of the self fault detection device is too complex, and the manufacturing is difficult, the cost of product is too high, or the practicality is low, which results in the decreased reliability of the original circuit protection function of the circuit protection device due to the additional self detection circuit, and safety risk may occur.

SUMMARY OF THE INVENTION

The present invention is the extension of patent CN 101295609B, to provide a circuit protection device with automatic fault detection function. The contents described in patent CN101295609B will be quoted in the present application. The technical problem to be solved by the present invention is to provide a self fault detection circuit at the early stage of power-on for the circuit protection device. The other technical problem to be solved by the present invention is to provide a periodic self fault detection circuit for the circuit protection device. The further technical problem to be solved by the present invention is to supply a self fault detection circuit without interruption of power for load terminals of the circuit protection device. The still another technical problem to be solved by the present invention is to supply a self fault detection circuit without impairing the safety protection function of the protection circuit for the circuit protection device.

To solve the technical problems above, the technical scheme adopted in the present invention is as follows:

A circuit protection device with an automatic fault detection function, comprises a ground fault protection unit 1 and a self fault detection unit 2, wherein the ground fault protection unit 1 can achieve the ground fault protection function; wherein the self fault detection unit 2 automatically detects the operation condition of the ground fault protection unit 1, and achieves the self fault detection function. The ground fault protection unit 1 comprising: a ground fault detection circuit 101, an AC power source path 102 and a solenoid driving circuit 104, wherein the ground fault detection circuit 101 is used to detect the ground fault current generated on the AC power source path 102, and drive the solenoid driving circuit 104 to activate, and disconnect or connect the electrical path of the AC power source path 102. The self fault detection unit 2 comprises an self-test circuit 201, a measurement and control circuit 202 and an alarming circuit 203, wherein the self-test circuit 201 generates ground fault current used for fault self detection to the ground fault protection unit 1 under the control of the measurement and control circuit 202, the measurement and control circuit 202 detects the fault signal from the ground fault protection unit 1, and determine the operation condition of the ground fault protection unit 1, and send an alarming signal via the alarming circuit 203.

The ground fault detection circuit 101, comprises a ground fault current sensor 150, a grounded neutral sensor 160, a first DC power source 180 and a ground fault detection chip 170, wherein the ground fault detection chip 170 is used to detect the ground fault signal output from the ground fault current sensor 150 and the grounded neutral sensor 160, and output a trip signal to trigger the solenoid driving circuit 104. The first DC power source 180 is connected to the input terminals of AC power source, and generate direct current to power the ground fault detection chip 170, the cathode of the first DC power source 180 acts as the internal logic ground (GND) of the circuit protection device.

The AC power source path 102 comprises a first and a second AC power source terminals (T1, T2) for connecting AC power source, load terminals 26, 27 and/or power receptacles 34A/34B for connecting with load, a magnetic switch 88 of electrical path for connecting or disconnecting first and second AC power source terminals T1, T2, and load terminals 26, 27, and/or power receptacles 34A/34B. The first and second AC power source terminals T1, T2 are connected with the moving contacts of the magnetic switch 88 through conductors 91, 92, and load terminals 26, 27 and/or power receptacles 34A/34B are connected with the static contacts of the magnetic switch 88.

The solenoid driving circuit 104 comprises a diode 143, a trip coil 142, a silicon controlled rectifier (SCR) 141, a resistance 146, a capacitor 147 and a rectifier diode 188, wherein the anode of the diode 143 is connected with the first AC power source terminal T1, the cathode of the diode 143 is connected with the anode of the SCR 141 through the trip coil 142, the cathode of the SCR 141 is connected with GND, the anode of the rectifier diode 188 is connected with GND, and the cathode of the rectifier diode 188 is connected with the second AC power source terminal T2, the control pole of the SCR 141 is connected with an output end of the ground fault detection chip 170 via the resistance 146, and the capacitor 147 is connected between the control pole of the SCR 141 and GND, and the trip coil 142 is used to drive the magnetic switch 88.

The ground fault protection unit 1 further comprises a manual test circuit 103, the manual test circuit 103 is used to manually trigger and generate a ground fault current on the AC power source path 102, and the manual test circuit 103 comprises the ground fault test switch 35 and A resistance 131 which are serially connected, and the manual test circuit 103 is connected between the first and the second AC power source terminals T1, T2.

The self-test circuit 201 comprises a ground fault resistance 215, a rectifier diode 189 and a self-test triode 211, wherein the collector of the self-test triode 211 is connected, through the ground fault resistance 215, with the conductor 92 which passes through the grounded neutral sensor 160 and the ground fault current sensor 150, the conductor 92 is connected with the second AC power source terminal T2, and the emitter of the self-test triode 211 is connected with the first AC power source terminal T1 after passing through the rectifier diode 189.

The measurement and control circuit 202 comprises: a first fault signal input circuit branch 240, used to transmit the condition signal of the trip coil 142 in real time; a second fault signal input circuit branch 250, used to transmit the operation condition signal of the ground fault detection circuit 101 and the SCR 141; a detection chip 263, which is used to receive and detect in real time the output signals from the first fault signal input circuit branch 240 and the second fault signal input circuit branch 250, and start periodically fault self detection process, and determine the operation condition of the ground fault protection unit 1, and send the operation condition signal to the alarming circuit 203; and a second DC power source 270, wherein its output V2 is used to supply DC power to the self fault detection unit 2, and the cathode of the second DC power source 270 is connected with GND.

The input end of the first fault signal input circuit branch 240 is further connected between the anode of the SCR 141 and the trip coil 142, its output voltage VB1 is connected with the detection chip 263, the first fault signal input circuit branch 240 comprises at least one capacitor 242, AC power source is connected with the diode 143 and the trip coil 142, and then to a resistance 241, and the capacitor 242 is charged, so as to raise voltage on the capacitor 242, and then raise the VB1. The first fault signal input circuit branch 240 forms a delay circuit, when the diode 143 and the trip coil 142 have no fault, the VB1 will be increased from 0V to a preset reference voltage VH1 during predetermined time period TR1. When the diode 143 and/or the trip coil 142 is disconnected, the VB1 will be decreased to a preset reference voltage VL1 during predetermined time period, wherein VH1 is smaller than the V2, and VL1 is smaller than or equal to VH1.

The second fault signal input circuit branch 250, its input end is connected with the anode of the SCR 141, its output voltage VB2 is connected to the detection chip 263, the second fault signal input circuit branch 250 comprises a capacitor 252, the second DC power source 270, charges the capacitor 252 through the resistance 253, and/or charges the capacitor 252 by the detection chip 263 via the diode 268, and make the voltage on the capacitor 252 raise, so that the VB2 is raised. When the SCR 141 becomes conductive, the charge on the capacitor 252 are released by the SCR 141 via the diode 251, and so that the VB2 is decreased. The second fault signal input circuit branch 250 forms the other delay circuit, when the SCR 141 becomes non-conductive, the VB2 will be increased to the preset reference voltage VH2. When the SCR 141 becomes conductive, the VB2 will be decreased to a preset reference voltage VL2, wherein VH2 is smaller than the V2 and VL2 is smaller than or equal to VH2.

The detection chip 263 further detects the VB1, and controls the charge current of the capacitor 252. When the VB1 is greater than the VH1, or the VB1 is decreased from VH1 to a value greater than or equal to the VL1, the capacitor 252 is charged with a lower rate, so that the VB2 is increased slowly from the VL2 to a value greater than the VH2 during predetermined time period TR21. When the VB1 is smaller than VL1, or during the VB1 is increased from a value smaller than VL1 to a value smaller than or equal to VH1, the capacitor 252 is charged in a higher rate, so that the VB2 is increased from a value smaller than VL2 to a value greater than VH2 during a predetermined time period TR22 (TR22 is less than TR21).

The output of the detection chip 263 is connected with a base pole of the self-test triode 211 via a resistance 218, when the VB2 is greater than the VH2, or during the process when the VB2 is gradually decreased from a value greater than VH2 to a value greater than or equal to the VL2, the output VOUT of the detection chip 263 is high level, so that the self-test triode 211 becomes conductive. When the VB2 is smaller than VL2, or during the process the VB2 is increased from a value smaller than VL2 to a value smaller than or equal to VH2, the output VOUT of the detection chip 263 is at a low level, and the self-test triode 211 becomes non-conductive.

When the output VOUT of the detection chip 263 is transferred to a high level from a low level, the measurement and control circuit 202 starts a self fault detection process. During the self detection process, the ground fault detection circuit 101 triggers the SCR 141 to become conductive, and the VB2 is decreased from a value greater than VH2 to a value smaller than the VL2, the output VOUT of the detection chip 263 is transferred from a high level to a low level, and the self fault detection process is completed.

At the initial stage of power-on, the measurement and control circuit 202 carries out one or several self fault detection process according to the predetermined time period TR22 during the preset time period TR1. If the ground fault protection unit 1 has no fault, the measurement and control circuit 202 sends the prompt signal "System ok", and the alarming circuit 203 flashes one time or several times.

Alternatively, the measurement and control circuit 202 carries out one or several self fault detection process periodically, the periodic time is equal to the time period TR21. If the ground fault protection unit 1 has no fault, the measurement and control circuit 202 sends the prompt signal "System ok" during each self fault detection process, and the alarming circuit 203 flashes one time.

The self fault detection process above is used during the initial stage of power-on, and it is a self detection with a high frequency, and it is only performed during the short time period TR1 at the initial stage of power-on. During the time period TR1, the self fault detection process is performed for one time or several times with time interval of TR22.

The self fault detection process above is also used during the normal operation, which is a self detection process with lower frequency, and performed repeatedly according to predetermined time period, the time interval is TR21, TR21 is much greater than TR22. When the ground fault protection unit 1 malfunctions, the device exits the periodic self detection with a low frequency, and enters the self detection with a high frequency.

Further, during the self fault detection process, when faults occur to the ground fault detection circuit 101 and/or the SCR 141, and the SCR 141 becomes non-conductive, the self fault detection process cannot be completed normally, the measurement and detection circuit 202 sends alarming signal "System Fault", and the alarming circuit 203 sends continuous red flicker, or rapid flicker.

When the trip coil 142 is disconnected, the measurement and control circuit 202 will continuously perform the self fault detection process according to a predetermined time period TR22, and send alarming signal "System fault", and the alarming circuit 203 will flicker rapidly with red light.

When the anode of the SCR 141 is short to the ground, the measurement and control circuit 202 will not start the self fault detection periodically, the alarming circuit 203 will not flicker periodically, or the alarming circuit 203 flashes rapidly, and send the alarming signal "System fault".

The diode 251 in the second fault signal input circuit branch 250 plays the unilateral conductive role in the circuit, when it is at positive conductive cycle, it supplies the electric path to release the charge in the capacitor 252. When it becomes non-conductive, it can achieve the high impedance between the trip coil 142 and the second ground fault signal input circuit branch 250. The total resistance of the resistance 241 of the first fault signal input circuit branch 240 is greater than 1 MΩ, and used to achieve the high impedance separation between the ground fault protection unit 1 and the self fault detection unit 2.

According to the present invention, the first AC power source terminal T1 is connected with the phase line of the AC power source, and the second AC power source terminal T2 is connected with the neutral line of the AC power source, or the first AC power source terminal T1 is connected with the neutral line of the AC power source, and the second AC power source terminal T2 is connected with the phase line of the AC power source.

The waveform of the AC power source is periodical alternative wave, and includes two half waves: for the first half wave of AC power source, during the first half wave, the electric potential of the first AC power source terminal T1 is higher than the one of the second AC power source terminal T2. For the second half wave of AC power source, during the second half wave, the electric potential of the first AC power source terminal T1 is lower than the one of the second AC power source terminal T2.

When the phase line of the AC power source is connected with the first AC power source terminal T1, and the neutral line of the AC power source is connected with the second AC power source terminal T2, the first half wave of the AC power source is positive half wave of the AC power source. When the phase line of the AC power source is connected with the second AC power source terminal T2, and the neutral line of the AC power source is connected with the first AC power source terminal T1, the first half wave of the AC power source is negative half wave of the AC power source. The second half wave of the AC power source and the first half wave of the AC power source is at the two different half wave of the periodic wave of the AC power source.

The solenoid driving circuit 104 is a unilateral conductive circuit, during the first half wave of the AC power source, when the SCR 141 is conducted, the trip coil 142 can generate sufficient high trip current to disconnect the magnetic switch 88, and achieve the ground fault protection function. During the second half wave of the AC power source, no matter whether the SCR 141 is conductive or not, the trip coil 142 cannot generate the trip current, the magnetic switch 88 cannot be triggered.

The self-test circuit 201 according to the present invention is a unilateral conductive circuit, during the second half wave of the AC power source, when the self-test triode 211 becomes conductive, the self-test circuit 201 can generate ground fault current for self fault detection in the AC power source path 102. During the first half wave of the AC power source, no matter whether the self-test triode 211 is conductive or not, the self-test circuit 201 will be under non-conductive condition, so no ground fault current can be generated.

During any time of AC power source periodic wave, the measurement and control circuit 202 according to the present invention can make the self-test triode 211 conductive, and achieve the self fault detection function without selecting phase and interrupting power supply.

The circuit protection device with self fault detection function according to the present invention, the ground fault protection unit can achieve the ground fault detection and protection function for AC power source power circuit and home appliance. The self fault detection unit is provided with two delay circuits which can achieve the fault detection at early stage of power-on and periodically fault detection function. The ground fault protection circuit and self fault detection unit can operate in time sharing, and achieve self fault detection without interruption of power supply. The self fault detection unit and the ground fault protection unit are separated from high impedance. Any fault occurred on any element in the self fault detection unit may not impair the protection ability of the ground fault protection unit. The simply, economic, and high efficiency of the circuit solve the inconvenience of manual detection and eliminate safety risk.

EMBODIMENTS OF THE INVENTION

The following is a detailed description for the present invention according to the attached drawings and embodiment, and the following embodiment is not limited to the present invention.

Figure 1:
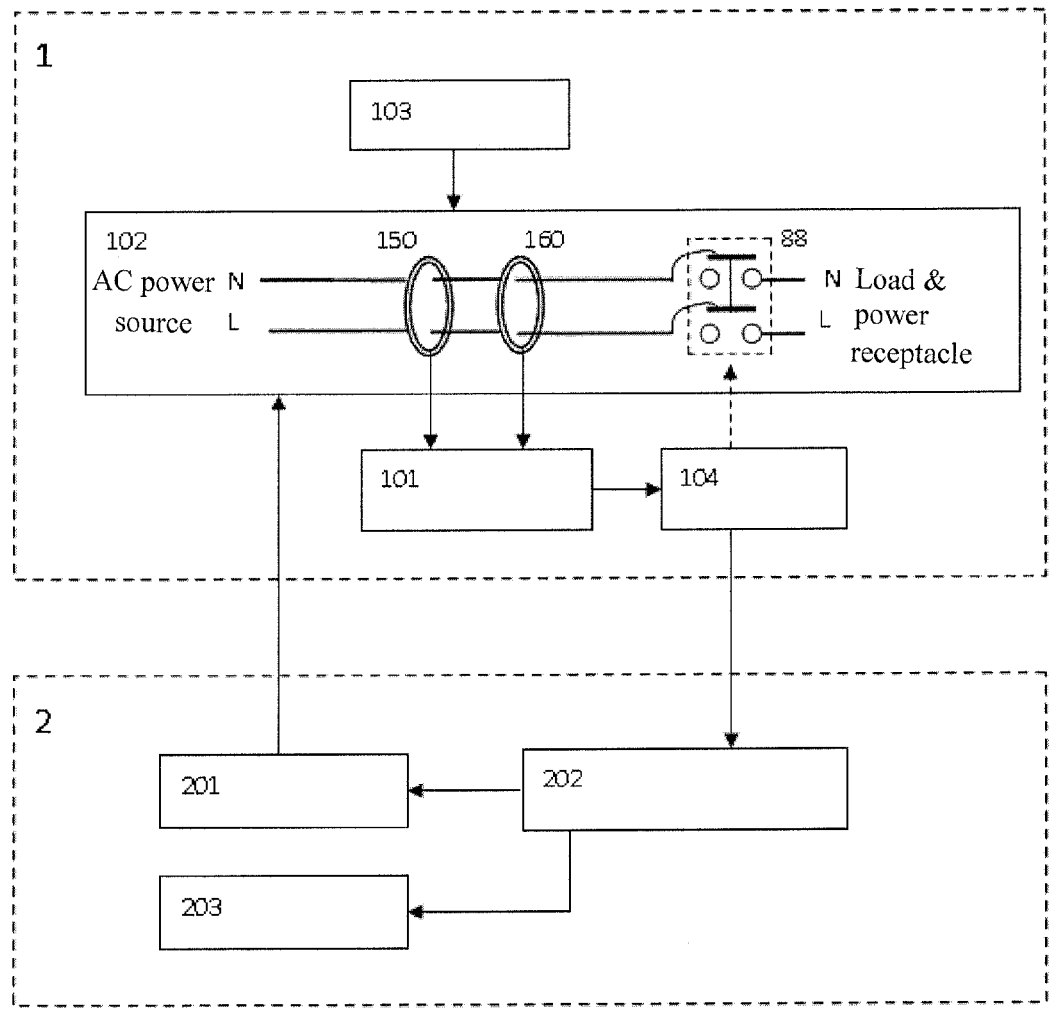
FIG. 1 shows a structural schematic diagram according to an embodiment of the present invention.

FIG. 1 is a structural schematic diagram showing a circuit protection device with self fault detection function according to an embodiment of the present invention. The circuit protection device includes a ground fault protection unit 1 and a self fault detection unit 2.

Wherein, the ground fault protection unit 1 includes a ground fault detection circuit 101, an AC power source path 102, a manual test circuit 103, and a solenoid driving circuit 104. The ground fault detection circuit 101, the AC power source path 102 and the solenoid driving circuit 104 form a ground fault protection circuit which can operate independently. The manual test circuit 103 simulates a ground fault current which is used to test the ground fault protection function.

The self fault detection unit 2 includes a self-test circuit 201, a measurement and control circuit 202 and an alarming circuit 203. The self fault detection unit 2 and the ground fault protection unit 1 form a closed loop control system, and the ground fault protection unit 1 is the object to be detected by the self fault detection unit 2, to achieve the self fault detection function. The process is as follows: under the control of the measurement and control circuit 202, the self-test circuit 201 generates a ground fault current for self fault detection to the ground fault protection unit 1, the measurement and control circuit 202 detects the fault condition feedback signal from the ground fault protection unit 1, and determines whether the ground fault protection unit 1 is working properly, and sends alarming signals via the alarming circuit 203.

Figure 2:
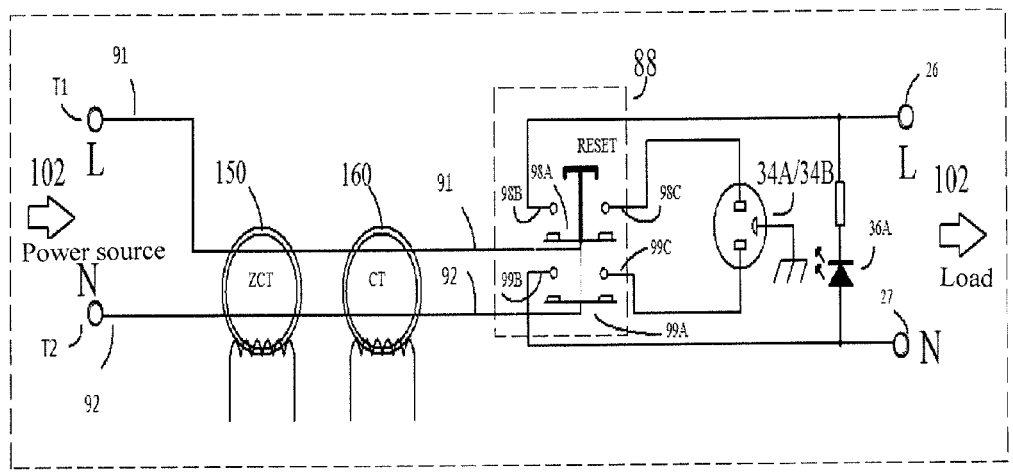
FIG. 2 shows an AC power source wiring diagram according to an embodiment of the present invention.

FIG. 2 shows an AC power source wiring diagram, and shows a wiring way of the AC power source in the AC power source path 102 as illustrated in FIG. 1, wherein the phase line L of the AC power source is connected with the AC power source terminal T1, and the neutral line N of the AC power source is connected with the AC power source terminal T2.

Figure 3:
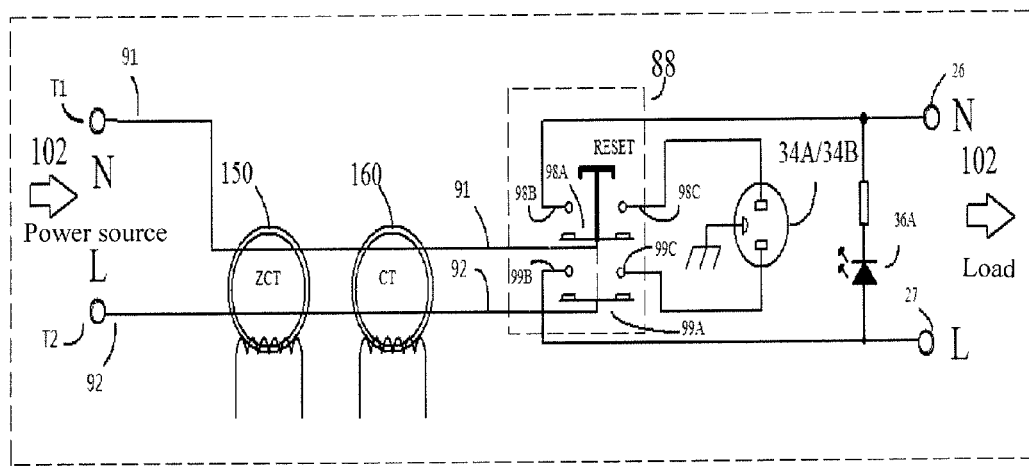
FIG. 3 shows an AC power source wiring diagram according to another embodiment of the present invention.

FIG. 3 shows another AC power source wiring diagram, and shows another wiring way of the AC power source in the AC power source path 102 as illustrated in FIG. 1, wherein the phase line L of the AC power source is connected with the AC power source terminal T2, and the neutral line N of the AC power source is connected with the AC power source terminal T1.

As shown in FIGS. 2 and 3, the AC power source is connected between the terminal T1 and terminal T2 of the AC power source. The waveform of the AC power source is periodical alternative wave, such as sine wave, each periodic wave includes two half waves: for the first half wave of AC power source, when the AC power source is connected between the terminal T1 and T2 of the AC power source, during the first half wave, the electric potential of the AC power source terminal T1 is higher than the one of the AC power source terminal T2, i.e. generates a positive voltage between the terminals T1 and T2 of the AC power source. For the second half wave of AC power source, when the AC power source is connected between the terminals T1 and T2 of the AC power source, during the second half wave, the electric potential of the AC power source terminal T1 is lower than the one of the AC power source terminal T2, i.e. generates a negative voltage between the terminals T1 and T2 of the AC power source.

As the wiring ways of AC power source in the AC power source path 102, the first half wave of the above AC power source can be positive half wave or negative wave of AC power source: when the phase line of the AC power source is connected with the AC power source terminal T1, the neutral line of the AC power source is connected with the AC power source terminal T2, the first half wave of the AC power source is at the positive half wave of the AC power source (at the time, the electrical potential of the phase line is higher than one of the neutral line). When the phase line of the AC power source is connected with the AC power source terminal T2, the neutral line of the AC power source is connected with the AC power source terminal T1, the first half wave of AC power source is at the negative half wave of the AC power source (at the time, the electrical potential of the phase line is lower than one of the neutral line). At same time, the second half wave of the AC power source and the first half wave of the AC power source are at the two different half wave of the periodic wave of the AC power source, and the second half wave of AC power source can be negative or positive half wave of the AC power source.

Figure 4:
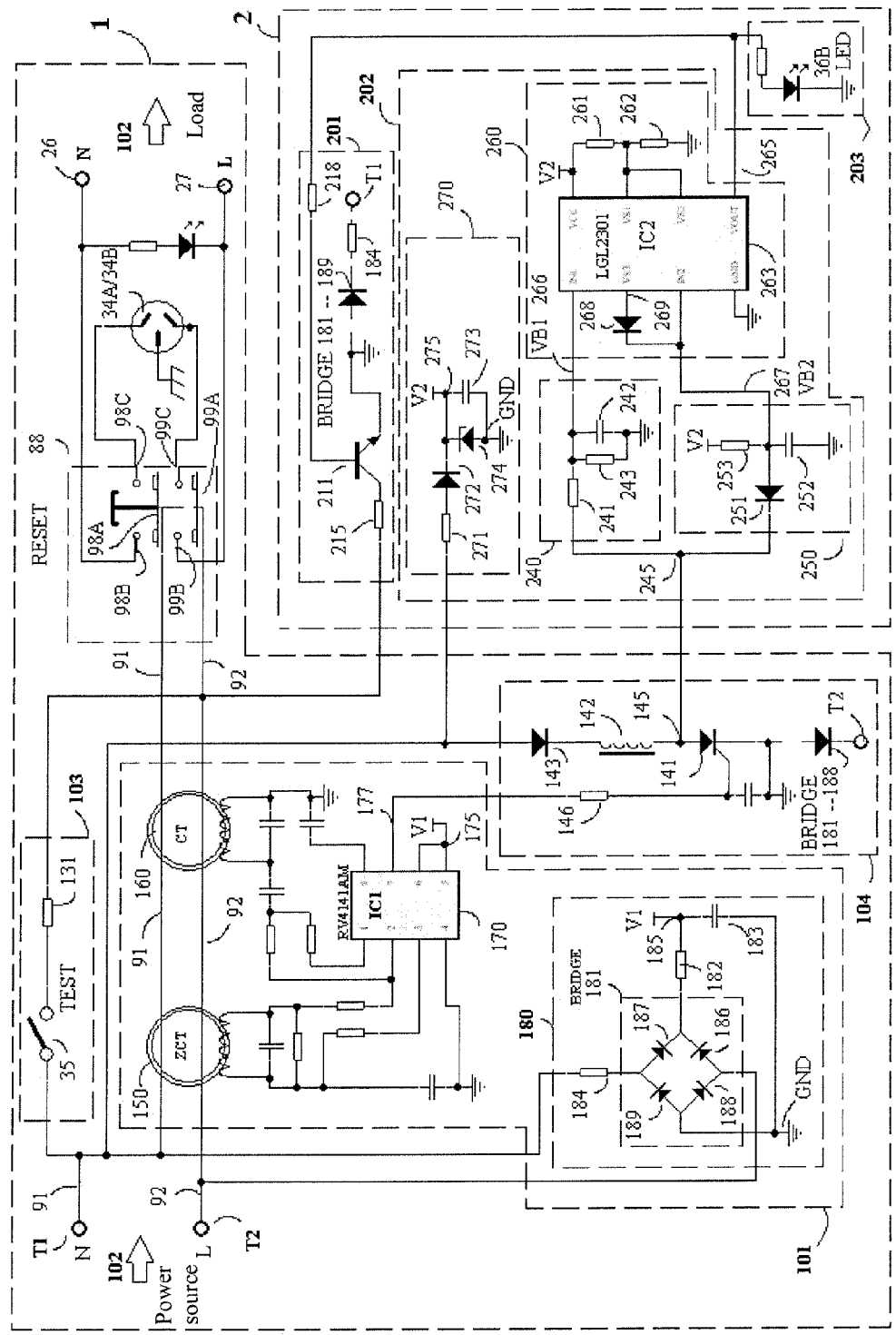
FIG. 4 shows a circuit schematic diagram according to an embodiment of the present invention.

FIG. 4 shows a schematic diagram of circuit according to an embodiment of the present invention, wherein the wiring way of the AC power source is shown in FIG. 3. The ground fault detection circuit 101 comprises a ground fault current sensor 150, a grounded neutral sensor 160, a first DC power source 180 and a ground fault detection chip 170 and its peripheral circuits. The output of the ground fault current sensor 150 and the grounded neutral sensor 160 are connected with the ground fault detection chip 170.

The first DC power source 180 comprises a resistance 184, a rectifier bridge 181, a resistance 182 and a capacitor 183, the output anode V1 of the first DC power source 180 (185 in FIG. 4) is connected with the ground fault chip 170 (175 n FIG. 4), the cathode of the first DC power source 180 acts as the logic ground (GND) inside the ground fault protection unit 1 and the self fault detection unit 2.

The AC power source path 102 comprises AC power source terminals T1, T2, load terminals 26, 27, power receptacles 34A/34B, conductors 91 and 92, and a magnetic switch 88. The one end of the conductor 91 is connected with the AC power source terminal T1, and the other end of the conductor 91 is connected with the moving contact 98A of the magnetic switch 88 passing through the ground fault current sensor 150 and the grounded neutral sensor 160. The one end of the conductor 92 is connected with the AC power source terminal T2, and the other end of the conductor 92 is connected with the moving contact 99A of the magnetic switch 88 passing through the ground fault current sensor 150 and the grounded neutral sensor 160. The static contacts (98B, 98C, 99B, 99C) of the magnetic switch 88 are respectively connected with wiring the terminals of load terminals (26, 27) and power receptacles (34A/34B). When the magnetic switch 88 is closed, AC power source is connected with the load terminals and power receptacles via the magnetic switch 88. When the magnetic switch 88 is disconnected, the terminals T1, T2 of the AC power source is disconnected with the load terminals and power receptacles.

The solenoid driving circuit 104 includes a diode 143, a trip coil 142, a SCR 141, a resistance 146, a capacitor 147 and a diode 188 in the rectifier bridge 181. The AC power source terminal T1 is connected with the anode of the diode 143, the cathode of the diode 143 is connected with the anode of the SCR 141 via the trip coil 142, the cathode of the SCR 141 is connected with GND, and the anode of the diode 188 in the rectifier bridge 181 is connected with GND, and the cathode of the diode 188 is connected with the AC power source terminal T2. The control pole of the SCR 141 is connected with the output 177 of the ground fault detection chip 170 via the resistance 146. As the unilateral conductive function of the diode 143 and the diode 188, the magnetic driving circuit loop is also unilateral conductive. The process is: when the output 177 of the ground fault detection chip 170 is at high level, the SCR 141 becomes conductive, during the first half wave of the AC power source, the diode 143 and the diode 188 become conductive, the trip coil 142 can trip, so that the magnetic switch 88 breaks off. During the second half wave of the AC power source, the diode 143 and the diode 188 become non-conductive, the trip coil 142 cannot trip, so that the magnetic switch 88 has no action.

The manual test circuit 103 includes a ground fault test switch 35 and a resistance 131 which are coupled in turn, one end of the manual test circuit 103 is connected with the AC power source terminal T1 and the other end of the manual test circuit 103 is connected with the AC power source terminal T2.

The ground fault protection function of the ground fault protection unit 1 is achieved by means of the ground fault detection circuit 101, the solenoid driving circuit 104 and the magnetic switch 88. The process is as follows: when the ground fault test switch 35 is turned on manually, or when any ground fault such as electrical leakage, electric shock occurs on load circuit and appliance, a ground fault current will be generated on the AC power source path 102. When the ground fault current on the AC power source path 102 exceeds the operating current to trip, the output 177 of the ground fault detection chip 170 is at a high level, and the SCR 141 becomes conductive via the resistance 146. As described above, during the first half wave of the AC power source (at this time, the diodes 143 and 188 become conductive), the trip coil 142 and the magnetic switch 88 operate, and the magnetic switch 88 in AC power source path 102 breaks off, and thereby disconnect the AC power source terminals T1, T2 and the load terminals 26, 27 and the power receptacles 34A/34B, and achieve the ground fault protection function.

The measurement and control circuit 202 includes a second DC power source 270, a fault signal input circuit branch 240, a fault signal input branch 250, a diode 268, a detection chip 263 and an auxiliary circuit (resistance 261, 262). The auxiliary circuit outputs VIH and VIL to the detection chip 263, and the detection chip 263 generates internal reference voltages VH1, VL1, VH2, and VL2 based on VIH and VIL. Wherein, VH1 is smaller than V2 (the output of the DC power source 270), and VL1 is smaller than or equal to VH1. VH2 is smaller than V2, and VL2 is smaller than or equal to VH2. VH1, VL1, VH2 and VL2 can also be generated directly by the detection chip 263, and in this case the auxiliary circuit can be omitted. In this embodiment, VH1 and VH2 are equal to VIH, and VL1 and VL2 are equal to VIL.

The DC power source 270 includes a resistance 271, a diode 272, a capacitor 273, and a stabilivolt 274. Its output anode V2 (275 in FIG. 4) is connected with terminal V2 in the self fault detection unit 2, and the output cathode is connected with GND.

The fault signal input circuit branch 240 includes resistances 241, 243 and a capacitor 242. The end of the capacitor 242 is connected with an IN1 pin (266 in FIG. 4) of the detection chip 263, and the other end of the capacitor 242 is connected with GND. The anode of SCR 141 is connected with the IN1 pin of the detection chip 263 via the resistance 241, and the resistance 243 is connected in parallel with the capacitor 242. When the trip coil 142 and the diode 143 have no fault, the capacitor 242 is charged by AC power source through the diode 143, the trip coil 142 and the resistance 241, so that the VB1 on the capacitor 242 increases from 0V to over VIH (or VH1) during a predetermined time period TR1, such as 5 seconds. When the trip coil 142 and/or the diode 143 is disconnected, the VB1 will decreases to smaller than VIL (or VL1) during a predetermined time period, such as 1 second. The detection chip 263 determines if the trip coil 142 and the diode 143 is disconnected by detection of VB1.

The fault signal input circuit branch 250 includes a diode 251, a resistance 253 and a capacitor 252. One end of the capacitor 252 is connected with an IN2 pin (267 in FIG. 4) of the detection chip 263, and the other end of the capacitor 252 is connected with GND. The DC power source V2 is connected with the IN2 pin of the detection chip 263 via the resistance 253, the cathode of the diode 251 is connected with the anode of the SCR 141 and the anode of the diode 251 is connected with the IN2 pin of the detection chip 263. The capacitor 252 is charged via the resistance 253 by means of the DC power source V2, and/or the capacitor 252 is charged via the pin VS3 of the detection chip 263 and a diode 268, and/or the capacitor 252 is charged via the other pin of the detection chip 263. The charge in the capacitor 252 is released by means of the SCR 141 and the diode 251. When the SCR141 becomes non-conductive, the voltage VB2 on the capacitor 252 will be raised to over VIH (or VH2). When the SCR 141 becomes conductive, the VB2 will be reduced to smaller than VIL (or VL2), until the current passing through the SCR141 is smaller than minimum available current value, the SCR141 becomes non-conductive. The fault condition of the ground fault detection circuit 101 and the solenoid driving circuit 104 is detected by the detection chip 263 by detecting VB2.

The detection chip 263 detects the voltage VB1 of the capacitor 242, and controls the charge current of the capacitor 252. When the VB1 is greater than VIH, or during the VB1 value reducing from a value greater than VIH to a value greater than or equal to VIL, the fault signal input circuit branch 250 and/or the detection chip 263 forms a charge circuit. As described above, with the lower charge current I1 to the capacitor 252, the capacitor 252 is charged with a lower rate, so that the voltage VB2 on the capacitor 252 is increased to a value greater than VIH from a value smaller than VIL during a predetermined time period TR 21, such as 60 seconds. When VB1 is smaller than the VIL, or during VB1 is gradually increased to a value smaller than or equal to VIH from a value smaller than VIL, the internal charge circuit is formed by the fault signal input circuit branch 250, and/or the charge circuit is formed by the pins of detection chip 263. As described above, with the greater charge current I2 to the capacitor 252, the capacitor 252 is charged with a high rate, so that the voltage VB2 on the capacitor 252 is increased to a value greater than VIH from a value smaller than VIL during a predetermined time period TR 22, such as 1 second, wherein, TR22 is smaller than TR21, and I2 is greater than I1.

The voltage VB2 on the capacitor 252 is detected by the detection chip 263, when VB2 value is smaller than VIL, or VB2 value is gradually increased from a value smaller than VIL to a value smaller than or equal to VIH, the output VOUT (265 in FIG. 4) of the detection chip 263 is at low level. When VB2 value is greater than VIH, or VB2 value is gradually reduced from a value greater than VIH to a value greater than or equal to VIL, the output VOUT of the detection chip 263 is at high level.

The self-test circuit 201 comprises a resistance 218, a self-test triode 211, a ground fault resistance 215, a resistance 184 and a diode 189 in the bridge rectifier 181. The base of the self-test triode 211 is connected with the output VOUT of the detection chip 263 via the resistance 218. The collector of the self-test triode 211 is connected via the ground fault resistance 215 with the conductor 92 passing through the ground fault current sensor 150 and the grounded neutral sensor 160. The emitter of the self-test triode 211 is connected with the GND. The emitter of the self-test triode 211 is connected with the AC power source terminal T1 passing through the diode 189 and resistance 184.

During the full cycle of AC power source, including positive half wave and negative half wave, the circuit described in patent CN101295609B generates randomly the ground fault current for self fault detection without selection of phase, i.e. during the positive half wave or negative half wave of AC power source, generating the ground fault current for self fault detection.

The present invention is optimized according to the patent CN101295609B: during any time of full cycle of AC power source, the detection chip 263 makes the self-test triode 211 conductive via the resistance 263. The self-test circuit 201 is also provided with at least one diode 189, with the unilateral conductive function, the diode 189 can make the self-test circuit 201 generate the ground fault current for self fault detection only during the second half wave of AC power source.

The circuit protection device designed according to the present invention can achieve the self fault detection function without power interruption. The method is: the ground fault detection unit 1 and the self fault detection unit 2 operate in time sharing mode, so that the solenoid driving circuit 104 becomes conductive during the first half wave of AC power source and becomes non-conductive during the second half wave of AC power source. The self-test circuit 201 becomes conductive during the second half wave of AC power source, and becomes non-conductive during the first half wave of AC power source. The detection process is as follows: the detection chip 263 outputs at a high level and makes the self-test triode 211 in the self-test circuit 201 become conductive, during the second half wave of AC power source (at this time, the diode 189 becomes conductive), the ground fault current is generated by the self-test circuit 201 and flows though the AC power source 102, and makes SCR 141 become conductive. During the time period, as the solenoid driving circuit 104 is in cut-off state, and cannot make the trip coil 142 and the magnetic switch 88 trigger, thereby the self fault detection function can be achieved without power interruption.

The ground fault protection unit 1 according to the present invention is divided into two parts for fault detection. The first part performs the periodic detection for the ground fault detection circuit 101 and the SCR 141. The second part performs the real-time detection for the diode 143 and the trip coil 142.

The periodic detection process is as follows: when the voltage VB2 on the capacitor 252 is increased from a value smaller than VIL to a value greater than VIH, the output VOUT of the detection chip 263 is at a high level (>2V), makes the self-test triode 211 in the self-test circuit 201 become conductive, and a ground fault simulated current is generated by the self-test circuit 201. When no fault occurs in the ground fault detection circuit 101 and the SCR 141 and auxiliary circuit, the SCR 141 becomes conductive, the charge on the capacitor 252 are released rapidly via the diode 251 and the SCR 141, the VB2 is rapidly reduced to a value smaller than VIL. At this time, the VOUT is turned to a low level from a high level, the self-test triode 211 is non-conductive, the ground fault simulated current disappears, the SCR 141 releases the charge on the capacitor 252 until SCR 141 is non-conductive, the periodic detection process is completed. If no fault occurs in ground fault detection circuit 101 and the SCR 141 and its auxiliary circuit, a signal "System ok" is output by detection chip 263. If any fault occurs at the ground fault detection 101 and/or the SCR 141 and its auxiliary circuit, the SCR 141 becomes non-conductive or short to ground. If the SCR 141 becomes non-conductive, the VB2 keeps a value greater than VIH, and the periodic detection process will continue (no finish point), an alarm signal "System fault" is output by the detection chip 263. When the SCR 141 is short to ground, the VB2 will keep continuously at a value smaller than VIL, and the self fault detection unit 2 has no way to perform the subsequent self test, the alarm signal "System fault" is sent by detection chip 263.

The periodic detection process as described above according to the present invention is performed for one time or several times at the early stage of power-on. When AC power source is connected with the AC power source terminals T1 and T2, the VB1 is increased gradually from 0V to a value smaller than or equal to VIH during a predetermined time period VB1, such as 5 seconds, during the time period, as described above, the capacitor 252 is charged with a high rate, the VB2 is increased rapidly from a value smaller than VIL to a value greater than VIH, and the periodic detection process as described above is carried out for one time, and the detection process is completed. After that, the detection chip 263 detects continuously the VB1, if the VB1 is still smaller than or equal to VIH, the process above is repeated again, until the VB1 is greater than VIH, and the detection process at early stage of power-on is completed. The time taken during detection process at the early stage of power-on is determined according to the charge time TR1 of the capacitor 242, the interval time between two detection processes is determined according to the charge time TR22 of the capacitor 252.

After the detection process at the early stage of power-on, or after the periodic detection process last time, the capacitor 252 is charged with low rate, the VB2 is increased from a value smaller than VIL to a value greater than VIH during a predetermined time period TR21, such as 60 seconds, and then the periodic detection process is carried out as described above, the charge in the capacitor 252 is released, the VB2 is decreased, the SCR 141 is cut-off, and then the capacitor 252 is charged again, and repeated periodically. The interval time between two detection processes is determined according to the charge time TR21 of the capacitor 252.

The present invention is to perform the real-time detection for the trip coil 142 and the diode 143. The process is as follows: when no fault occurs at the trip coil 142 and the diode 143, the VB1 is greater than VIH, the self fault detection unit 2 continues to periodically detect according to a predetermined time period. When the trip coil 142 and/or the diode 143 malfunctions due to broken circuit, as described above, the VB1 is decreased to a value smaller than VIL, the self fault detection unit 2 starts the continuous no-ending periodic detection process same as the early stage of power-on, and the detection chip 263 sends alarm signal "System fault" to the alarming circuit 203.

The alarming circuit 203 receives the alarm signal from the detection chip 263, and sends the signal in form of sound or light to indicate the operation state of the circuit protection device. In FIG. 4, the alarm circuit 203 comprises one LED 36B, if no fault occurs at the ground fault protection unit 1, the LED in the alarm circuit 203 flashes one time or several times. If fault occurs at the ground fault protection unit 1, the LED in the alarm circuit 203 flashes continuously or illustrated for long time, or not illustrated.

The self fault detection unit 2 and the ground fault protection unit 1 according to the present invention are separated from high impedance. Any fault occurred on any element in the self fault detection unit 2 may not impair the protection ability of the ground fault protection unit 1. The method is as following: the fault signal input circuit branch 240 comprises at least one high impedance resistance, such as resistance 241, and achieves the high impedance separation between the ground fault protection unit 1 and the fault signal input circuit branch 240. The fault signal input circuit branch 250 comprises at least one unilateral conductive diode, such as the diode 251, by means of reverse cut-off features of the diode 251, and achieves the high impedance separation between the self fault detection unit 2 and the ground fault protection unit 1.

It is to be understood that both the attached drawings and embodiments are intended to provide further explanation of the function, structure and principles of the present invention as claimed and not limited to the present invention. Also the objects of the present invention have been achieved. The above described embodiments may be modified without departing from the spirit or scope of the invention, thus, the present invention covers the scope described in the claims.

The invention claimed is:

1. A circuit protection device with automatic fault monitoring and detection function characterized in that the device comprises: a ground-fault protection unit (1) and a self fault detection unit (2), wherein the ground-fault protection unit (1) achieves ground-fault protection function, and the self fault detection unit (2) automatically detects operation condition of the ground-fault protection unit (1) and achieves fault self detection function;

wherein said ground-fault protection unit (1) comprises a ground-fault detection circuit (101), an AC power source path (102) and a solenoid driving circuit (104), wherein, the ground-fault detection circuit (101) is used to detect the ground-fault current on the AC power source path (102), and drive the solenoid driving circuit (104) to trip, and thus interrupt or connect the AC power source path (102);

wherein said self fault detection unit (2) comprises a self-test circuit (201), a measurement and control circuit (202) and an alarming circuit (203), the self-test circuit (201) generates the ground fault current used for fault self detection to the ground-fault protection unit (1) under the control of the measurement and control circuit (202), the measurement and control circuit (202) detects the fault signal from the ground-fault protection unit (1), and determines operation condition of the ground-fault protection unit (1), and sends alarming signals via the alarming circuit (203);

wherein said ground-fault detection circuit (101) comprises a ground-fault current sensor (150), a grounded neutral sensor (160), a first DC power source (180) and a ground-fault detection chip (170), wherein, the ground-fault detection chip (170) is used to detect a ground-fault signal from the ground-fault current sensor (150) and the grounded neutral sensor (160), and output a trip signal to drive said solenoid driving circuit (104); wherein an input end of the first direct current (DC) power source (180) is connected to the AC power source, and the first DC power source (180) outputs direct current source to the ground fault detection chip (170), a negative pole of the first DC power source (180) acts as an internal logical ground (GND) of the circuit protection device;

wherein said AC power source path (102) comprises a first AC power source terminal (T1) and a second AC power source terminal (T2) both for connecting to the AC power supply; load terminals (26, 27) and/or power receptacle (34A/34B) for connecting to load; and a magnetic switch (88) used to connect or disconnect electrical path between the first and second AC power source terminals (T1, T2), and load terminals (26, 27) and/or power receptacles (34A/34B); wherein conductors (91, 92) used to connect the first and second AC power source terminals (T1, T2) with moving contacts of the magnetic switch (88), and the load terminals (26, 27) and/or power receptacles (34A/34B) connect with static contacts of the magnetic switch (88);

wherein said solenoid driving circuit (104) comprises a diode (143), a trip coil (142), a silicon controlled rectifier (SCR) (141), a resistance (146) and a rectifier diode (188), wherein, an anode of the diode (143) is connected to said first AC power source terminal (T1), a cathode of the diode (143) is connected to an anode of the SCR (141) via the trip coil (142), a cathode of the SCR (141) is connected to the GND, an anode of the rectifier diode (188) is connected to the GND, and a cathode of the rectifier diode (188) is connected to said second AC power source terminal (T2), a control pole of the SCR (141) is connected to the ground fault detection chip (170), wherein, the trip coil (142) is used to drive the magnetic switch (88);

wherein said self-test circuit (201) comprises a ground fault resistance (215), a rectifier diode (189) and a self-test triode (211), wherein the collector of the self-test triode (211) is connected, through the ground fault resistance (215), with the conductor (92) which passes through said grounded neutral sensor (160) and said ground fault current sensor (150), the conductor (92) is connected with said second AC power source terminal (T2), and an emitter of the self-test triode (211) is connected with said first AC power source terminal (T1) after passing through the rectifier diode (189); and wherein said measurement and control circuit (202) comprises: a first fault signal input circuit branch (240), used to transmit the condition signal of said trip coil (142) in real time; a second fault signal input circuit branch (250), used to transmit operation condition signal of said ground fault detection circuit (101) and said SCR (141); a detection chip (263), used to receive and monitor the output signal from the first fault signal input circuit branch (240) and the second fault signal input circuit branch (250) at regular time, start periodically self fault detection process, and determine operation condition of said ground fault protection unit (1), and send the operation condition signal to said alarming circuit (203); a second DC power source (270) whose output is used to provide a DC power source V2 to said self fault detection unit (2), and the cathode of output of the second DC power source (270) is connected with said GND.

2. The circuit protection device according to claim 1, characterized in that, said ground fault protection unit (1) comprises a manual test circuit (103), wherein the manual test circuit (103) is used to manually trigger and generate a ground fault current on said AC power source path (102), and the manual test circuit (103) comprises a ground fault test switch (35) and a resistance (131) which are connected in turn, and the manual test circuit (103) is connected between said first and second AC power source terminals (T1, T2).

3. The circuit protection device according to claim 1, characterized in that, said first fault signal input circuit branch (240), its input end is connected between the anode of the said SCR (141) and the said trip coil (142), its output voltage VB1 is connected with the said detection chip (263), the first fault signal input circuit branch (240), comprises at least one capacitor (242), a AC power source is connected with said diode (143), and said trip coil (142), and then to a resistance (241), and charges the capacitor (242), so as to raise the voltage on the capacitor (242), and then raise the VB1;

wherein the first fault signal input circuit branch (240) forms a delay circuit, when the diode (143) and the trip coil (142) have no fault, the VB1 will be increased from 0V to a preset reference voltage VH1 during a predetermined time period TR1; when the diode (143) and/or the trip coil (142) is disconnected, the VB1 is decreased to a preset reference voltage VL1 during the predetermined time period, wherein the VH1 is smaller than said V2, and the VL1 is smaller than or equal to the VH1;

said second fault signal input circuit branch (250), its input end is connected with the anode of the SCR (141), its output VB2 is connected to the detection chip (263), the second fault signal input circuit branch (250) comprises a capacitor (252), the second DC power source (270) charges the capacitor (252) through the resistance (253), and/or charges the capacitor (252) by the detection chip (263) via the diode (268), and increase the voltage on the capacitor (252), so that the VB2 is raised; when the SCR (141) becomes conductive, the charge on the capacitor (25) are released by the SCR (141) via the diode (251), and so that the VB2 is lowered;

wherein the second fault signal input circuit branch (250) forms the other delay circuit, when the SCR (141) becomes non-conductive, the VB2 will be increased to a value greater than a preset reference voltage VH2; when the SCR (141) becomes conductive, the VB2 will be reduced to a value smaller than a preset reference voltage VL2, wherein the VH2 is smaller than the V2, and the VL2 is smaller than or equal to the VH2.

4. The circuit protection device according to claim 3, characterized in that, said detection chip (263) monitors said VB1, and controls the charge current of said capacitor (252); when the VB1 is greater than said VH1, or the VB1 is decreased from VH1 to a value greater than or equal to said VL1, the capacitor (252) is charged with a lower rate, so that said VB2 is increased slowly from said VL2 to a value greater than said VH2 during a predetermined time period TR21; when the VB1 is smaller than VL1, or during the VB1 is increased from a value smaller than VL1 to a value smaller than or equal to VH1, the capacitor (252) is charged in a higher rate, so that the VB2 is increased rapidly from a value smaller than VL2 to a value greater than VH2 during a predetermined time period TR22, the TR22 being less than the TR21;

wherein the output of the detection chip (263) is connected with a base pole of said self-test triode (211) via a resistance (218), when the VB2 is greater than VH2, or during the VB2 is gradually decreased from a value greater than VH2 to a value greater than or equal to VL2, the output VOUT of the detection chip (263) is a high level, so that self-test triode (211) becomes conductive; when the VB2 is smaller than VL2, or during the VB2 is increased from a value smaller than VL2 to a value smaller than or equal to VH2, the output VOUT of the detection chip (263) is a low level, and the self-test triode (211) becomes non-conductive;

wherein when the output VOUT of the detection chip (263) is transferred to a high level from a low level, said measurement and control circuit (202) starts a self fault detection process, during the self fault detection process, said ground fault detection circuit (101) triggers said SCR (141) to become conductive, and the VB2 is decreased from a value greater than VH2 to a value smaller than VL2, the output VOUT of the detection chip (263) is transferred from a high level to a low level, and the self fault detection process is completed.

5. The circuit protection device according to claim 4, characterized in that, at an initial stage of power-on, said measurement and control circuit (202) carries out one or several said self fault detection process with a time interval of TR22 during the preset time period TR1; if said ground fault protection unit (1) has no fault, the measurement and control circuit (202) sends the prompt signal "system ok", and said alarming circuit (203) flashes one time or several times.

6. The circuit protection device according to claim 5, characterized in that, during said self fault detection process, when faults occur with said ground fault detection circuit (101) and/or said SCR (141), and the SCR (141) becomes non-conductive, the self fault detection process cannot be completed normally, said measurement and detection circuit (202) sends an alarming signal "system fault", and said alarming circuit (203) sends continuous flicker, or rapid flicker.

7. The circuit protection device according to claim 5, characterized in that, when said trip coil (142) was broken, said measurement and control circuit (202) continually carries out said self fault detection process at said interval time period of TR22, and sends alarming signal "system fault", and said alarming circuit (203) flickers rapidly with red light.

8. The circuit protection device according to claim 5, characterized in that, when the anode of said SCR (141) is short to the ground, said measurement and control circuit (202) does not start the self fault detection periodically, said alarming circuit (203) will not flicker at a preset time, or the alarming circuit (203) flashes rapidly, and sends the alarming signal "system fault".

9. The circuit protection device according to claim 4, characterized in that, said measurement and control circuit (202) carries out one or several said self fault detection process periodically, the period time is equal to said time period TR21; if the ground fault protection unit (1) has no fault, the measurement and control circuit (202) sends the prompt signal "system ok" during each self fault detection process, and the alarming circuit (203) flashes one time.

10. The circuit protection device according to claim 9, characterized in that, during said self fault detection process, when faults occur with said ground fault detection circuit (101) and/or said SCR (141), and the SCR (141) becomes non-conductive, the self fault detection process is not completed normally, said measurement and detection circuit (202) sends an alarming signal "system fault", and said alarming circuit (203) sends continuous flicker, or rapid flicker.

11. The circuit protection device according to claim 9, characterized in that, when the anode of said SCR (141) is short to the ground, said measurement and control circuit (202) does not start the self fault detection periodically, said alarming circuit (203) will not flicker at a preset time, or the alarming circuit (203) flashes rapidly, and sends the alarming signal "system fault".

12. The circuit protection device according to claim 3, characterized in that, said diode (251) in said second fault signal input circuit branch (250) plays a unilateral conductive role in the circuit, when the diode (251) is at a positive conductive cycle, the diode (251) supplies an electric path to release the charge in said capacitor (252), when the diode (251) becomes non-conductive, the diode (251) can realize the high impedance between the trip coil (142) and the second ground fault signal input circuit branch (250); a total resistance of the said resistance (241) in said first fault signal input circuit branch (240) is greater than 1 MΩ, and used to realize the high impedance separation between the ground fault protective unit (1) and the self fault detection unit (2).

13. The circuit protection device according to claim 1, characterized in that, said first AC power source terminal (T1) is connected with a phase line of AC power source, and said second AC power source terminal (T2) is connected with a neutral line of AC power source; alternatively, the first AC power source terminal (T1) is connected with the neutral line of AC power source, and the second AC power source terminal (T2) is connected with the phase line of AC power source.

14. The circuit protection device according to claim 13, characterized in that, the waveform of the AC power source is periodical alternative wave, and includes two half waves; wherein for a first half wave of AC power source, during the first half wave, the electric potential of the first AC power source terminal (T1) is higher than the one of the second AC power source terminal (T2); for a second half wave of AC power source, during the second half wave, the electric potential of the first AC power source terminal (T1) is lower than the one of the second AC power source terminal (T2).

15. The circuit protection device according to claim 14, characterized in that, when the phase line of the AC power source is connected with the first AC power source terminal (T1), and the neutral line of the AC power source is connected with the second AC power source terminal (T2), said first half wave of the AC power source is the positive half wave of the AC power source; when the phase line of AC power source is connected with the second AC power source terminal (T2), and the neutral line of AC power source is connected with the first AC power source terminal (T1), said first half wave of the AC power source is the negative half wave of the AC power source; the second half wave of the AC power source and the first half wave of the AC power source is at the two different half wave of the periodic wave of the AC power source.

16. The circuit protection device according to claim 15, characterized in that, said solenoid driving circuit (104) being a unilateral conductive one, during said first half wave of the AC power source, when said SCR (141) is conducted, said trip coil (142) generates sufficient high trip current to trip said magnetic switch (88), and achieve the ground fault protection function; during said second half wave of the AC power source, no matter whether the SCR (141) is conductive or not, the trip coil (142) does not generate the trip current, the magnetic switch (88) does not trigger.

17. The circuit protection device according to claim 15, characterized in that, a self-test circuit (201) is a unilateral conductive circuit, during said second half wave of the AC power source, when said self-test triode (211) becomes conductive, the self-test circuit (201) generates ground fault current for self fault detection in said AC power source path (102); during said first half wave of the AC power source, no matter whether the self-test triode (211) is conductive or not, the self-test circuit (201) will be under non-conductive, so no ground fault current is generated.

18. The circuit protection device according to claim 15, characterized in that, during any time of the AC power source periodic wave, the output high level of said measurement and control circuit (202) make said self-test triode (211) become conductive, and achieve the self fault detection function without selecting phase and interrupting the AC power source.

\* \* \* \* \*